US012537174B2

(12) United States Patent
Ishikawa et al.

(10) Patent No.: US 12,537,174 B2
(45) Date of Patent: Jan. 27, 2026

(54) WAFER PLACEMENT TABLE

(71) Applicant: NGK INSULATORS, LTD., Nagoya (JP)

(72) Inventors: Masaki Ishikawa, Handa (JP); Tatsuya Kuno, Handa (JP); Tomoya Ina, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 351 days.

(21) Appl. No.: 18/302,027

(22) Filed: Apr. 18, 2023

(65) Prior Publication Data

US 2024/0128063 A1 Apr. 18, 2024

Related U.S. Application Data

(63) Continuation of application No. PCT/JP2022/038367, filed on Oct. 14, 2022.

(51) Int. Cl.
*H01J 37/32* (2006.01)

(52) U.S. Cl.
CPC .... *H01J 37/32724* (2013.01); *H01J 37/3244* (2013.01); *H01J 37/32642* (2013.01)

(58) Field of Classification Search
CPC ............. H01J 37/3744; H01J 37/32642; H01J 37/32724
USPC .......................................................... 414/787
See application file for complete search history.

(56) References Cited

U.S. PATENT DOCUMENTS

| | | | | | |
|---|---|---|---|---|---|
| 2,436,723 | A * | 2/1948 | Machin | A01D 87/00 | 414/717 |
| 2,643,011 | A * | 6/1953 | Brisson | E02F 3/342 | 414/718 |
| 2,693,279 | A * | 11/1954 | Box | B03C 1/0332 | 209/215 |
| 2,788,138 | A * | 4/1957 | Stueland | E02F 3/6463 | 414/710 |

(Continued)

FOREIGN PATENT DOCUMENTS

| | | | | |
|---|---|---|---|---|
| EP | 3925506 A1 * | 12/2021 | A47L 11/33 |
| JP | H05-021585 A | 1/1993 | |

(Continued)

OTHER PUBLICATIONS

Korean Reasons for Revocation dated Mar. 4, 2025 (Application No. 2699420).

(Continued)

*Primary Examiner* — Terrell H Matthews
(74) *Attorney, Agent, or Firm* — BURR PATENT LAW, PLLC

(57) ABSTRACT

A wafer placement table includes a ceramic plate that has at least a wafer placement part at an upper surface thereof, a cooling plate that is joined to a lower surface of the ceramic plate and that has a refrigerant flow path, gas common paths that are provided above the refrigerant flow path, gas introduction paths that extend from a lower surface of the cooling plate to a corresponding one of the gas common paths, and a plurality of gas distribution paths, that are provided for the gas common paths. The gas distribution path that is disposed at an outermost periphery of the ceramic plate is provided at a position that does not overlap the refrigerant flow path in plan view.

6 Claims, 6 Drawing Sheets

(56) References Cited

U.S. PATENT DOCUMENTS

| | | | | |
|---|---|---|---|---|
| 3,014,586 | A * | 12/1961 | Ross | B03C 1/30 209/215 |
| 3,343,675 | A * | 9/1967 | Budd | B03C 1/28 209/215 |
| 3,935,947 | A * | 2/1976 | Barrett | B03C 1/22 209/636 |
| 4,245,855 | A * | 1/1981 | Larson | B66C 23/80 280/765.1 |
| 4,828,690 | A * | 5/1989 | Montez | E01H 12/00 209/418 |
| 5,395,148 | A * | 3/1995 | Jameson | B03C 1/02 209/215 |
| 6,142,310 | A * | 11/2000 | Haase | A47L 13/41 209/215 |
| 7,095,305 | B2 * | 8/2006 | Shiao | B03C 1/28 335/289 |
| 7,137,823 | B2 * | 11/2006 | Naganishi | H01R 9/2466 439/949 |
| 7,331,470 | B2 * | 2/2008 | Vernon | B03C 1/0332 209/418 |
| 7,337,745 | B1 | 3/2008 | Komino et al. | |
| 7,553,121 | B2 * | 6/2009 | Curotto | B65F 3/046 414/812 |
| 7,681,276 | B2 * | 3/2010 | Rothweil | A47L 13/44 15/228 |
| 8,157,101 | B2 * | 4/2012 | Arnold | B03C 1/0332 209/418 |
| 8,971,009 | B2 * | 3/2015 | Parkhe | H01L 21/6831 361/234 |
| 9,266,672 | B2 * | 2/2016 | Stewart | B65F 3/04 |
| 9,809,383 | B2 * | 11/2017 | Ford | B65F 3/041 |
| 9,926,134 | B2 * | 3/2018 | Ford | B65F 3/041 |
| 11,600,510 | B2 * | 3/2023 | Ito | H01L 21/6833 |
| 12,106,994 | B2 * | 10/2024 | Kuno | H01L 21/6833 |
| 2005/0018376 | A1 | 1/2005 | Park et al. | |
| 2007/0084759 | A1 * | 4/2007 | Shiao | B03C 1/14 209/221 |
| 2009/0168292 | A1 | 7/2009 | Watanabe et al. | |
| 2012/0160808 | A1 | 6/2012 | Kikuchi et al. | |
| 2015/0077895 | A1 | 3/2015 | Jindo et al. | |
| 2019/0131163 | A1 | 5/2019 | Kuno et al. | |
| 2021/0082731 | A1 | 3/2021 | Miyazawa | |
| 2021/0272834 | A1 | 9/2021 | Takayama | |
| 2022/0219896 | A1 * | 7/2022 | Gary | B65F 3/08 |

FOREIGN PATENT DOCUMENTS

| | | | | |
|---|---|---|---|---|
| JP | 2002-184851 | A | 6/2002 | |
| JP | 4021864 | B2 | 12/2007 | |
| JP | 2008-147549 | A | 6/2008 | |
| JP | 4929150 | B2 | 5/2012 | |
| JP | 2012-134375 | A | 7/2012 | |
| JP | 5666748 | B1 | 2/2015 | |
| JP | 2020-115536 | A | 7/2020 | |
| JP | 2021-048243 | A | 3/2021 | |
| JP | 2021-141116 | A | 9/2021 | |
| JP | 2023-170942 | A | 12/2023 | |
| KR | 20140071467 | A * | 6/2014 | H01L 21/6831 |
| KR | 20210099513 | A * | 8/2021 | H01L 21/6833 |
| TW | 492075 | B | 6/2002 | |
| TW | 201907514 | A | 2/2019 | |
| TW | 202114046 | A | 4/2021 | |
| WO | WO-2010095720 | A1 * | 8/2010 | H01L 21/67109 |
| WO | 2018/216797 | A1 | 11/2018 | |

OTHER PUBLICATIONS

Taiwanese Office Action dated Sep. 30, 2024 (Application No. 112133582).

International Search Report and Written Opinion (Application No. PCT/JP2022/038367) dated Jan. 17, 2023.

Japanese Notice of Dispatch of Duplicates of a Written Opposition (with English translation) dated Mar. 11, 2025 (Application No. 2023-523102).

English translation of the International Preliminary Report on Patentability (Chapter I) dated Apr. 24, 2025 (Application No. PCT/JP2022/038367).

* cited by examiner

WAFER PLACEMENT TABLE

BACKGROUND OF THE INVENTION

1. Field of the Invention

The present invention relates to a wafer placement table.

2. Description of the Related Art

To date, a wafer placement table including a ceramic plate that has a wafer placement part at its upper surface, a cooling plate that is joined to a lower surface of the ceramic plate, and a refrigerant flow path that is provided in the cooling plate has been known. For example, in a wafer placement table in Patent Literature 1, gas introduced from a lower surface of a cooling plate is supplied from a gas common path that is provided above a refrigerant flow path and that is C-shaped in cross section to an upper surface of a ceramic plate by passing through a gas distribution path through a plurality of gas branch parts, the gas branch parts extending in a radially outward direction from the gas common path, the gas distribution path extending through the ceramic plate in an up-down direction.

CITATION LIST

Patent Literature

PTL 1: Japanese Unexamined Patent Application Publication No. 2021-141116

SUMMARY OF THE INVENTION

However, although when using a wafer placement table, a large stress may be produced in the gas distribution path that is positioned at an outermost periphery of the wafer placement table, Patent Literature 1 does not consider this point, as a result of which cracks may be produced in the wafer placement table. In particular, when a wafer is processed by using high-power plasma, such cracks tend to be produced.

The present invention has been made to overcome such a problem, and a primary object of the present invention is to prevent cracks from being produced in a wafer placement table.

[1] A wafer placement table of the present invention comprises: a ceramic plate that has at least a wafer placement part at an upper surface thereof; a cooling plate that is joined to a lower surface of the ceramic plate and that has a refrigerant flow path; a gas common path that is provided, of an inside of the wafer placement table, at a location above the refrigerant flow path; a gas introduction path that extends from a lower surface of the cooling plate to the gas common path; and a gas distribution path that extends from the gas common path to the upper surface of the ceramic plate, a plurality of the gas distribution paths being provided for the gas common path, wherein the gas distribution paths have an outermost peripheral gas distribution path that is disposed at an outermost periphery of the ceramic plate, the outermost peripheral gas distribution path is provided at a position that does not overlap the refrigerant flow path in plan view.

In the wafer placement table, of the gas distribution paths, the outermost peripheral gas distribution path that is disposed at the outermost periphery of the ceramic plate is provided at a position that does not overlap the refrigerant flow path in plan view. When using the wafer placement table, a large stress tends to be produced at the outermost periphery of the wafer placement table. When the outermost peripheral gas distribution path overlaps the refrigerant flow path in plan view, since a portion directly above the refrigerant flow path is thin and tends to be deformed, cracks tend to be produced near the outermost peripheral gas distribution path. However, here, since the outermost peripheral gas distribution path is provided at a position that does not overlap the refrigerant flow path in the plan view, it is possible to decrease stress near the outermost peripheral gas distribution path and to prevent cracks from being produced.

Note that, in the present description, the present invention is described by using terms, such as up, down, left, right, front, and rear. However, up, down, left, right, front, and rear merely refer to relative positional relationships. Therefore, when the orientation of the wafer placement table is changed, up and down may become left and right, or left and right may become up and down.

Accordingly, such cases are also included in the technical scope of the present invention.

[2] In the wafer placement table described above (the wafer placement table in [1] above), the gas distribution paths may be connected to the gas common path through a gas branch part. If this is the case, for example, when, in plan view, the gas branch part from the gas common path crosses the refrigerant flow path and reaches a position that does not overlap the refrigerant flow path, it is possible to relatively easily provide the gas distribution paths at positions that do not overlap the refrigerant flow path.

[3] In the wafer placement table described above (the wafer placement table in [1] or [2] above), a plurality of the gas common paths may be concentrically provided, and the outermost peripheral gas distribution path may be connected to, of the plurality of the gas common paths, the gas common path that is positioned at an outermost periphery. If this is the case, it is possible to increase the number of gas distribution paths that open into the upper surface of the ceramic plate. In addition, since a large stress tends to be produced in the gas distribution path that is connected to the gas common path that is positioned at the outermost periphery, application of the present invention is of great significance.

[4] In the wafer placement table described above (the wafer placement table in any one of [1] to [3] above), at least a portion of the gas distribution path that is connected to the gas common path may have a width that is larger than a width of the gas common path. If this is the case, since a relatively large stress tends to be produced at the large-width portion of each gas distribution path that is connected to the gas common path, application of the present invention is of great significance.

[5] In the wafer placement table described above (the wafer placement table in any one of [1] to [4] above), the cooling plate may be made of a composite material of a metal and a ceramic. Since such a composite material is a material that is relatively fragile and that tends to be cracked, application of the present invention is of great significance.

[6] In the wafer placement table described above (the wafer placement table in any one of [1] to [5] above), the wafer placement part that is formed circularly and a ring-shaped focus ring placement part that surrounds the wafer placement part may be provided at the upper surface of the ceramic plate, and the outermost peripheral gas distribution path may be a path that extends from the gas common path to the focus ring placement part.

[7] In the wafer placement table described above (the wafer placement table in any one of [1] to [5] above), the wafer placement part that is formed circularly may be provided at the upper surface of the ceramic plate, and the outermost peripheral gas distribution path may be a path that extends from the gas common path to the wafer placement part.

DETAILED DESCRIPTION OF THE INVENTION

Figure 1:
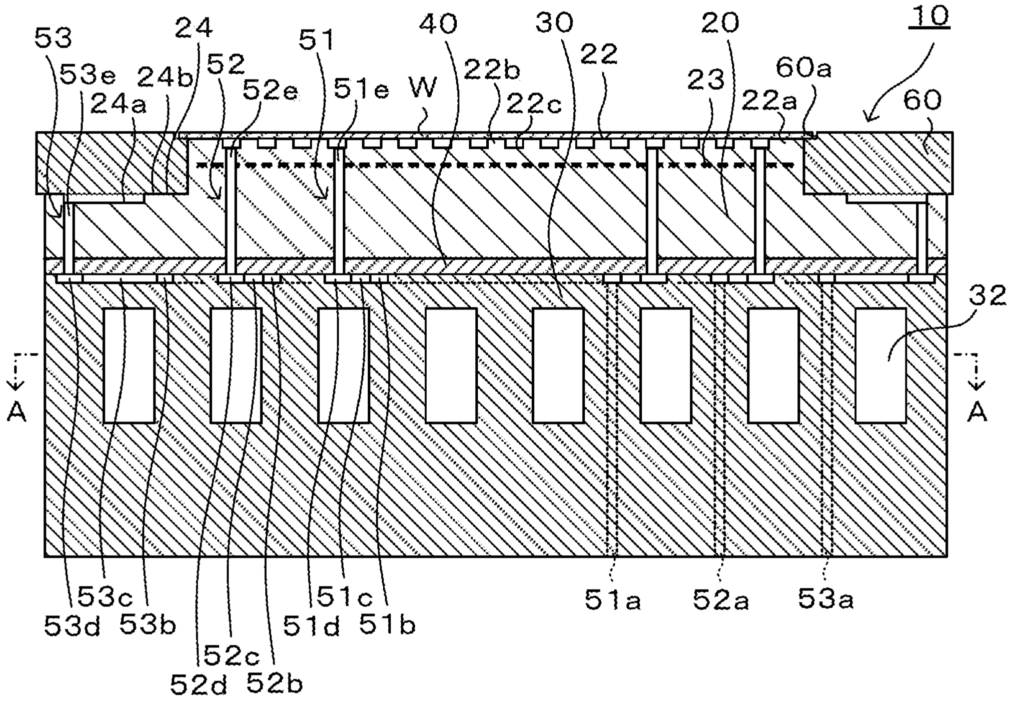
FIG. 1 is a vertical cross-sectional view of a wafer placement table 10.
Figure 2:
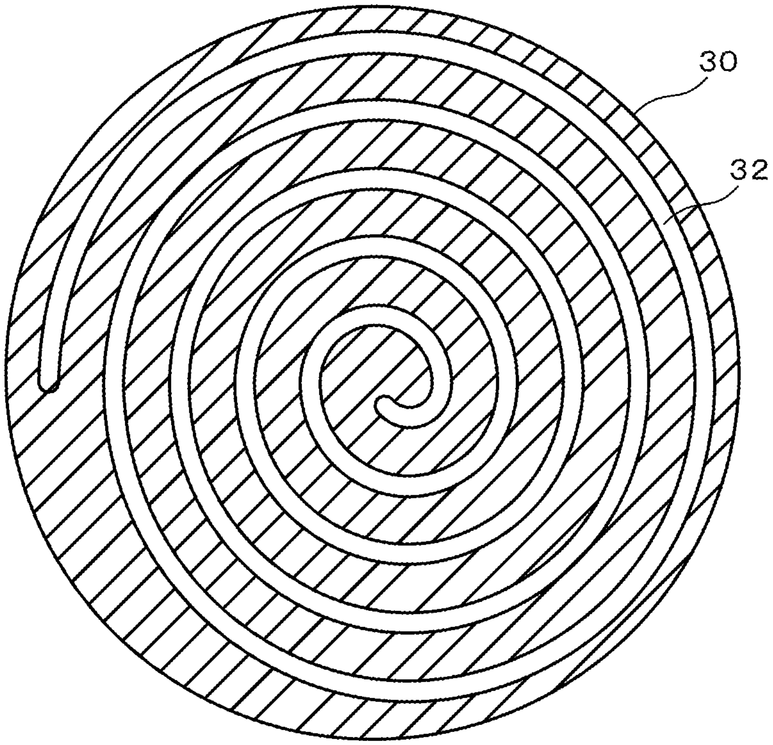
FIG. 2 is a cross-sectional view along A-A in FIG. 1.
Figure 3:
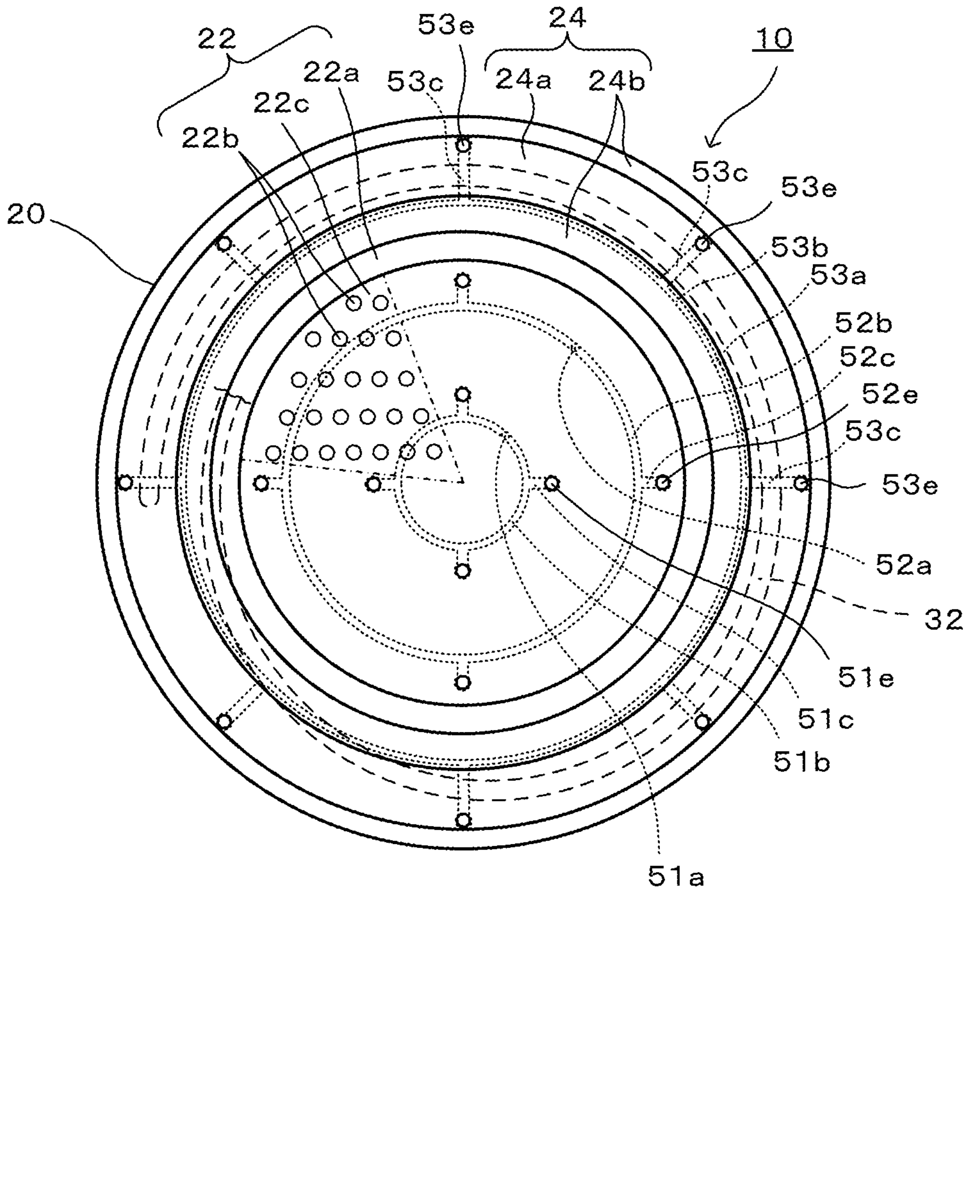
FIG. 3 is a plan view of the wafer placement table 10.
Figure 4:
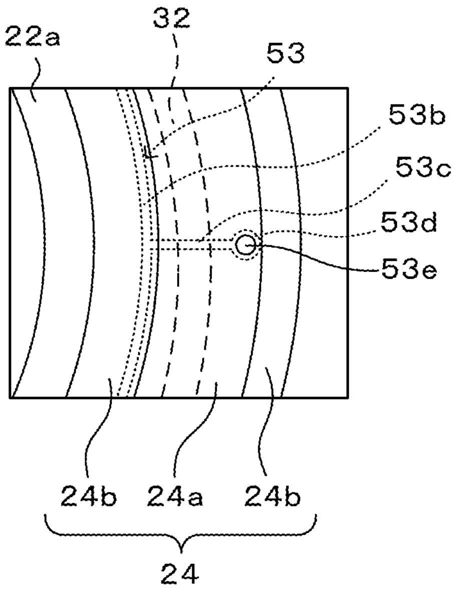
FIG. 4 is a partial enlarged view of FIG. 3.
Figure 5:
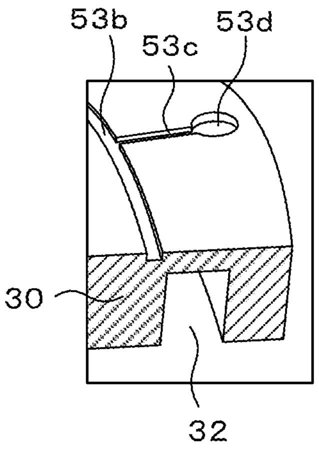
FIG. 5 is a perspective view of the vicinity of a gas relay groove 53*d* of a cooling plate 30.

Next, a preferred embodiment of the present invention is described by using the drawings. FIG. 1 is a vertical cross-sectional view of a wafer placement table 10 (cross-sectional view when the wafer placement table 10 is cut by a plane including a central axis of the wafer placement table 10), FIG. 2 is a cross-sectional view along A-A in FIG. 1, FIG. 3 is a plan view of the wafer placement table 10, FIG. 4 is a partial enlarged view of FIG. 3, and FIG. 5 is a perspective view of the vicinity of a gas relay groove 53*d* of a cooling plate 30. Note that, in FIG. 2, the illustration of structural elements other than a refrigerant flow path 32 has been omitted.

The wafer placement table 10 is used for performing, for example, CVD or etching on a wafer W by using plasma. The wafer placement table 10 includes a ceramic plate 20, the cooling plate 30, and a metal joint layer 40.

The ceramic plate 20 is made of a ceramic material as typified by, for example, alumina or aluminum nitride, and has a circular wafer placement part 22 at its upper surface. The wafer W is placed on the wafer placement part 22. A seal band 22*a* is formed at the wafer placement part 22 along an outer edge, and a plurality of small circular protrusions 22*b* are formed in an entire surface of the wafer placement part 22. The height of the seal band 22*a* and the height of the small circular protrusions 22*b* are the same, and the height is, for example, a few μm to several tens of μm. An electrode 23 is a planar mesh electrode that is used as an electrostatic electrode, and a direct-current voltage is applicable thereto. When a direct-current voltage is applied to the electrode 23, the wafer W is attracted and fixed to the wafer placement part 22 (specifically, an upper surface of the seal band 22*a* and upper surfaces of the small circular protrusions 22*b*) by an electrostatic attraction force; and when the application of the direct-current voltage is stopped, the attraction and fixing of the wafer W to the wafer placement part 22 is stopped. Note that, of the wafer placement part 22, a portion where the seal band 22*a* and the small circular protrusions 22*b* are not provided is called a "reference surface 22*c*". Although, in FIG. 3, the small circular protrusions 22*b* provided in a region surrounded by an alternate long and short dash line in the wafer placement part 22 is shown, the small circular protrusions 22*b* are actually provided in the entire surface of a region surrounded by the seal band 22*a* in the wafer placement part 22.

In addition to the wafer placement part 22, a ring-shaped focus ring placement part 24 is provided around the wafer placement part 22 at the upper surface of the ceramic plate 20. A focus ring may hereunder be abbreviated as "FR" below. The FR placement part 24 is disposed one step lower than the wafer placement part 22. A ring-shaped focus ring 60 is placed on the FR placement part 24. A circumferential groove 60*a* is provided above an inner surface of the focus ring 60 to prevent contact with the wafer W. The FR placement part 24 has a ring-shaped recessed groove 24*a*, and an FR support surface 24*b* that is provided on an inner peripheral side and an outer peripheral side of the recessed groove 24*a*. The depth of the recessed groove 24*a* is a few μm to several tens of μm. The FR support surface 24*b* is a ring-shaped surface, and directly contacts the focus ring 60 to support the focus ring 60.

The cooling plate 30 is a disk-shaped member made of a fragile electrically conductive material. The cooling plate 30 has a refrigerant flow path 32 inside which refrigerant can circulate. As shown in FIG. 2, the refrigerant flow path 32 is provided over the entire surface of the cooling plate 30 in a one-stroke pattern from one end (inlet) to the other end (outlet) in plan view. In the present embodiment, the refrigerant flow path 32 is spirally formed in the plan view. Such a cooling plate 30 can be made with reference to, for example, Japanese Patent No. 5666748. Refrigerant is supplied to the one end (the inlet) of the refrigerant flow path 32 from a refrigerant circulation device (not shown), passes through the refrigerant flow path 32, and then the refrigerant is discharged from the other end (the outlet) of the refrigerant flow path 32 and returns to the refrigerant circulation device. The refrigerant circulation device is capable of adjusting the temperature of the refrigerant to a desired temperature. It is preferable that the refrigerant be a liquid and that the refrigerant have an electrically insulating property. The electrically insulating liquid is, for example, a fluorinated inert liquid.

The fragile electrically conductive material is, for example, a composite material of a metal and a ceramic. The composite material of a metal and a ceramic is, for example, a metal matrix composite (MMC) or a ceramic matrix composite (CMC). Specific examples of such composites include a material including Si, SiC, and Ti, a material in which an SiC porous material is impregnated with Al and/or Si, and a composite material of $Al_2O_3$ and TiC. A material including Si, SiC, and Ti is called SiSiCTi, a material in which an SiC porous material is impregnated with Al is called AlSiC, and a material in which an SiC porous material is impregnated with Si is called SiSiC.

As the electrically conductive material used in the cooling plate 30, it is preferable to use a material whose thermal expansion coefficient is close to the thermal expansion coefficient of the ceramic plate 20. When the ceramic plate 20 is made of alumina, it is preferable that the cooling plate 30 be made of SiSiCTi or AlSiC. This is because the thermal expansion coefficients of SiSiCTi and AlSiC can be made substantially the same as the thermal expansion coefficient of alumina. A disk-shaped member made of SiSiCTi can be made, for example, as follows. First, silicon carbide, a metal Si, and a metal Ti are mixed to form a powdered mixture. Next, the obtained powdered mixture is formed into a disk-shaped molded body by uniaxial pressure-molding, and the molded body is sintered with a hot press in an inert atmosphere, to obtain the disk-shaped member made of SiSiCTi.

The metal joint layer 40 joins a lower surface of the ceramic plate 20 and an upper surface of the cooling plate 30. The metal joint layer 40 may be, for example, a layer formed from solder or a brazing metal material. The metal joint layer 40 is formed by, for example, TCB (Thermal compression bonding). TCB refers to a publicly known method in which a metal joining material is interposed between two members to be joined and the two members are pressed and joined while heated at a temperature less than or equal to the solidus temperature of the metal joining material.

The wafer placement table 10 has gas supply paths 51, 52, and 53. Of these, the gas supply paths 51 and 52 are paths for supplying gas to a space surrounded by the wafer W, the seal band 22*a*, the small circular protrusions 22*b*, and the reference surface 22*c*. The gas supply path 53 is a path for supplying gas to a space surrounded by the focus ring 60 and the recessed groove 24*a*. The gas supply path 51 is constituted by a gas introduction path 51*a*, a gas common path 51*b*, a gas branch part 51*c*, a gas relay groove 51*d*, and a gas distribution path 51*e*. The gas supply path 52 is constituted by a gas introduction path 52*a*, a gas common path 52*b*, a gas branch part 52*c*, a gas relay groove 52*d*, and a gas distribution path 52*e*. The gas supply path 53 is constituted by a gas introduction path 53*a*, a gas common path 53*b*, gas branch parts 53*c*, the gas relay groove 53*d*, and a gas distribution path 53*e*.

The gas common paths 51*b*, 52*b*, and 53*b* are ring-shaped paths that are concentrically formed and that have different diameters in plan view, and are formed above the refrigerant flow path 32 in the inside of the wafer placement table 10; in the present embodiment, the gas common paths 51*b*, 52*b*, and 53*b* are formed at an interface between the cooling plate 30 and the metal joint layer 40, specifically, in an upper surface of the cooling plate 30. The gas common path 51*b* is provided at an innermost periphery, and the gas common path 53*b* is provided at an outermost periphery. The gas introduction paths 51*a*, 52*a*, and 53*a* are provided from a lower surface of the cooling plate 30 to a corresponding one of the gas common paths 51*b*, 52*b*, and 53*b* so as not to cross the refrigerant flow path 32.

The outermost peripheral gas common path 53*b* has the plurality of gas branch parts 53*c* extending in a radially outward direction. The gas distribution path 53*e* extending through the ceramic plate 20 in an up-down direction is connected to each of the gas branch parts 53*c*. A connection portion between the gas branch parts 53*c* and the gas distribution path 53*e* is the gas relay groove 53*d* that is a round groove. The diameter (width) of the gas relay groove 53*d* is larger than the width of the gas distribution path 53*e* and the width of the gas common path 53*b* (including the gas branch parts 53*c*), and is 1.5 to 2.5 times greater. Similarly to the gas common path 53*b*, the innermost peripheral gas common path 51*b* is also connected to the gas distribution path 51*e* through the gas branch part 51*c* and the gas relay groove 51*d*. Similarly to the gas common path 53*b*, the gas common path 52*b* is also connected to the gas distribution path 52*e* through the gas branch part 52*c* and the gas relay groove 52*d*.

Of the plurality of gas distribution paths 51*e*, 52*e*, and 53*e*, the gas distribution path 53*e* (outermost peripheral gas distribution path) disposed at an outermost periphery of the ceramic plate 20 is, as shown in FIGS. 3 and 4, provided at a position that does not overlap the refrigerant flow path 32 in plan view. The gas relay groove 53*d* is also provided at a position that does not overlap the refrigerant flow path 32 in plan view. The positions that do not overlap the refrigerant flow path in the plan view are positions where the cooling plate 30 is thick. Therefore, even if the gas relay groove 53*d* having a large diameter is provided at such a position, stress produced in the gas relay groove 53*d* can be kept small. In contrast, positions that overlap the refrigerant flow path 32 in plan view are positions where the cooling plate 30 is thin. Therefore, if the gas relay groove 53*d* is provided at such a position, a large stress is produced in the gas relay groove 53*d*.

Stress that is produced in the gas relay grooves 51*d* and 52*d* is lower than the stress that is produced in the gas relay groove 53*d* provided at the outermost periphery. Therefore, although the gas relay grooves 51*d* and 52*d* and the gas distribution paths 51*e* and 52*e* may be provided at positions that overlap the refrigerant flow path 32 in plan view, it is preferable to provide them at positions that do not overlap the refrigerant flow paths 32. Although the gas common paths 51*b*, 52*b*, and 53*b* may be provided at positions that overlap the refrigerant flow path 32 in plan view because they have small widths, it is preferable to provide them at positions that do not overlap the refrigerant flow path 32.

Next, an example of use of the wafer placement table 10 is described. The wafer placement table 10 is fixed to the inside of a chamber (not shown) for a semiconductor process. The focus ring 60 is placed on the FR placement part 24, and the wafer W is placed on the wafer placement part 22. In this state, a direct-current voltage is applied to the electrode 23, and the wafer W is attracted to the wafer placement part 22. At the same time, gas (here, heat conduction gas, such as He) is supplied to the gas supply paths 51, 52, and 53. This causes the heat conductivity between the wafer W and the upper surface of the ceramic plate 20 and the heat conductivity between the focus ring 60 and the upper surface of the ceramic plate 20 to be good. Then, the inside of the chamber is set so as to have a prescribed vacuum atmosphere (or a reduced-pressure atmosphere), and, while supplying process gas from a shower head provided at a ceiling portion of the chamber, an RF voltage is applied to the cooling plate 30. This causes plasma to be produced between the wafer W and the shower head. Then, by making use of the plasma, the wafer W is subjected to CVD deposition and etching. Note that, as the wafer W is processed by using plasma, the focus ring 60 also becomes exhausted. However, since the focus ring 60 is thicker than the wafer W, the focus ring 60 is replaced after processing a plurality of wafers W.

When the wafer W is processed by using high-power plasma, the wafer W needs to be efficiently cooled. In the wafer placement table 10, as a joint layer between the ceramic plate 20 and the cooling plate 30, the metal joint layer 40 having a high thermal conductivity is used instead of a resin layer having a low thermal conductivity. Therefore, the capability of removing heat from the wafer W (heat removal capability) is high. Since the difference between the thermal expansion of the ceramic plate 20 and the thermal expansion of the cooling plate 30 is small, even if stress relaxation of the metal joint layer 40 is low, hindrances are less likely to occur. Further, since the temperature of the upper surface of the ceramic plate 20 is high and the temperature of the lower surface of the ceramic plate 20 is low, the upper surface of the ceramic plate 20 is likely to extend, and the wafer placement table 10 is likely to become a protrusion toward an upper side. Therefore, at an outermost periphery of the wafer placement table 10, deformation is large and stress tends to be produced. In the present embodiment, since the outermost peripheral gas distribution path 53*e* is provided at a position that does not overlap the refrigerant flow path 32 in plan view (position where the cooling plate 30 is thick), stress near the gas distribution path 53*e* is decreased.

In the wafer placement table 10 described above, the gas distribution path 53*e* that is disposed at the outermost periphery of the ceramic plate 20 is provided at a position that does not overlap the refrigerant flow path 32 in plan view. When using the wafer placement table 10, a large stress tends to be produced at the outermost periphery of the wafer placement table 10. When the outermost peripheral gas distribution path 53*e* overlaps the refrigerant flow path 32 in plan view, since a portion directly above the refrigerant flow path 32 is where the cooling plate 30 is thin and tends to be deformed, cracks tend to be produced near the gas distribution path 53*e*. However, in the present embodiment, since the gas distribution path 53*e* is provided at a position that does not overlap the refrigerant flow path 32 (position where the cooling plate 30 is thick) in the plan view, it is possible to decrease stress near the gas distribution path 53*e* and to prevent cracks from being produced.

Of the outermost peripheral gas distribution path 53*e*, the diameter (width) of the gas relay groove 53*d* connected to the gas branch parts 53*c* of the gas common path 53*b* is larger than the width of the gas common path 53*b* and the widths of the gas branch parts 53*c*. Therefore, although a relatively large stress tends to be produced in the gas relay groove 53*d*, stress can be kept small by applying the present invention.

Further, the outermost peripheral gas distribution path 53*e* is connected to the gas common path 53*b* through the gas branch parts 53*c* extending in a radial direction. Therefore, even if the refrigerant flow path 32 is provided near the gas common path 53*b*, when, in plan view, the gas branch parts 53*c* from the gas common path cross the refrigerant flow path 32 and reach positions that do not overlap the refrigerant flow path 32, it is possible to relatively easily provide the gas distribution path 53*e* and the gas relay groove 53*d* at positions that do not overlap the refrigerant flow path 32.

Further, since the gas common paths 51*b*, 52*b*, and 53*b* are concentrically provided, and are connected to a plurality of the gas distribution paths 51*e*, 52*e*, and 53*e*, it is possible to supply gas from a large number of positions on the upper surface of the ceramic plate 20. Since a large stress tends to be produced in the gas distribution path 53*e* that is connected to the gas common path 53*b* that is positioned at the outermost periphery, application of the present invention is of great significance.

The cooling plate 30 is made of a composite material of a metal and a ceramic. Since such a composite material is a material that is relatively fragile and that tends to be cracked, application of the present invention is of great significance.

Further, the circular wafer placement part 22 and the ring-shaped FR placement part 24 surrounding the wafer placement part 22 are provided at the upper surface of the ceramic plate 20, and the outermost peripheral gas distribution path 53*e* is a path that reaches the FR placement part 24 from the gas common path 53*b*. Therefore, in the ceramic plate 20 including such an FR placement part 24, the path that supplies gas to the FR placement part 24 is at the outermost periphery.

Note that the present invention is not limited in any way by the above-described embodiment, and it goes without saying that the present invention can be carried out in various modes as long as they appertain to the technical scope of the present invention.

Figure 6:
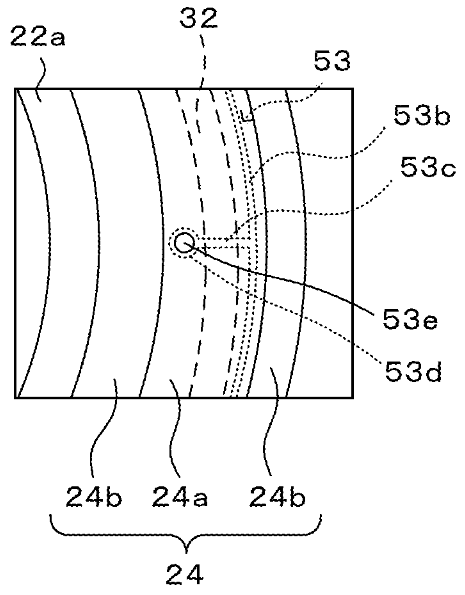
FIG. 6 is an explanatory view of a modification of a gas supply path 53.
Figure 7:
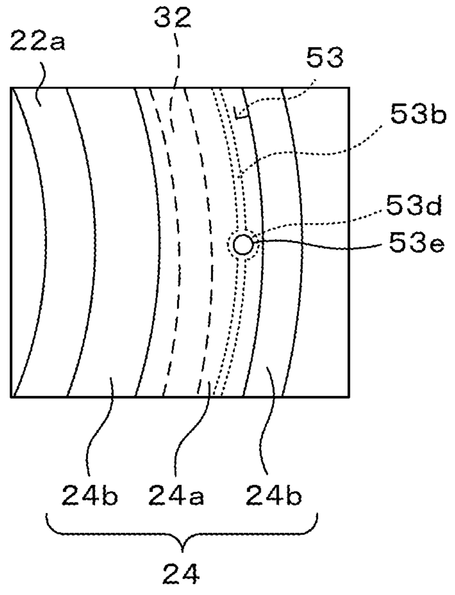
FIG. 7 is an explanatory view of a modification of a gas supply path 53.

Although, in the embodiment described above, the gas common path 53*b* and the gas distribution path 53*e* (the gas relay groove 53*d*) are connected to each other through the gas branch parts 53*c* extending in a radially outward direction from the gas common path 53*b*, the present invention is not particularly limited thereto. For example, as shown in FIG. 6, the ring-shaped gas common path 53*b* and the gas distribution path 53*e* (the gas relay groove 53*d*) may be connected to each other through the gas branch parts 53*c* extending in a radially inward direction from the gas common path 53*b*. Even in this case, the gas distribution path 53*e* (the gas relay groove 53*d*) is provided at a position that does not overlap the refrigerant flow path 32 in plan view. Alternatively, as shown in FIG. 7, in plan view, at least a part of the ring-shaped gas common path 53*b* may be provided at a position that does not overlap the refrigerant flow path 32, and the gas relay groove 53*d* and the gas distribution path 53*e* may be directly connected to this part. In FIGS. 6 and 7, structural elements corresponding to those of the embodiment described above are given the same reference numerals.

Figure 8:
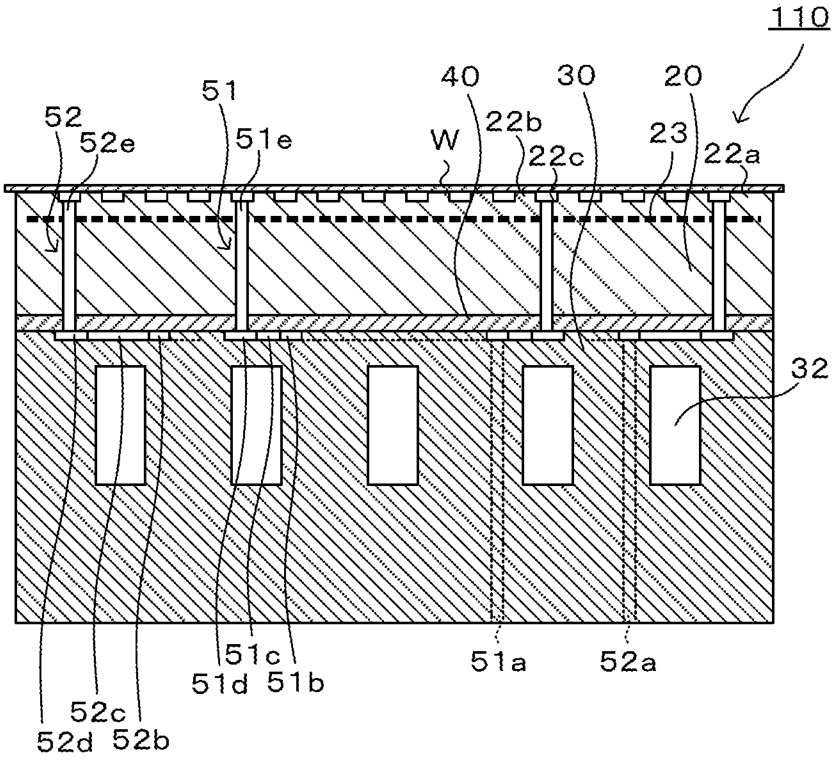
FIG. 8 is a vertical cross-sectional view of a wafer placement table 110.

Although, in the embodiment described above, an example in which the upper surface of the ceramic plate 20 has the wafer placement part 22 and the FR placement part 24 is given, the present invention is not limited thereto. For example, as in a wafer placement table 110 shown in FIG. 8, an upper surface of a ceramic plate 20 may have a wafer placement part 22 and may not have an FR placement part. The wafer placement table 110 has two gas supply paths, that is, gas supply paths 51 and 52. As in the embodiment described above, the gas supply path 51 is constituted by a gas introduction path 51*a*, a gas common path 51*b*, a gas branch part 51*c*, a gas relay groove 51*d*, and a gas distribution path 51*e*. As in the embodiment above, the gas supply path 52 is also constituted by a gas introduction path 52*a*, a gas common path 52*b*, a gas branch part 52*c*, a gas relay groove 52*d*, and a gas distribution path 52*e*. However, here, since the gas distribution path 52*e* becomes an outermost peripheral gas distribution path, the gas distribution path 52*e* and the gas relay groove 52*d* are provided at positions that do not overlap a refrigerant flow path 32 in plan view. This makes it possible to prevent cracks from being produced in the wafer placement table 110. In FIG. 8, structural elements corresponding to those of the embodiment described above are given the same reference numerals.

Although, in the embodiment described above, the gas common paths 51*b*, 52*b*, and 53*b*, the gas branch parts 51*c*, 52*c*, and 53*c*, and the gas relay grooves 51*d*, 52*d*, and 53*d* are provided at the interface between the cooling plate 30 and the metal joint layer 40 (specifically, at the upper surface of the cooling plate 30), the present invention is not limited thereto. For example, the gas common paths 51*b*, 52*b*, and 53*b*, the gas branch parts 51*c*, 52*c*, and 53*c*, and the gas relay grooves 51*d*, 52*d*, and 53*d* may be provided at the metal joint layer 40, or may be provided at an interface between the ceramic plate 20 and the metal joint layer 40 (specifically, the lower surface of the ceramic plate 20).

Although, in the embodiment described above, the shape of the gas common paths 51*b*, 52*b*, and 53*b* is a ring shape in plan view, the present invention is not limited thereto. For example, in the plan view, the shape of the gas common paths 51*b*, 52*b*, and 53*b* may be an arc shape (for example, a C shape), a linear shape, or a polygonal shape (for example, a shape extending along the sides of a polygon).

Although, in the embodiment described above, the gas introduction paths 51*a*, 52*a*, and 53*a* are each connected to one of the gas common paths 51*b*, 52*b*, and 53*b* corresponding thereto, the present invention is not limited thereto. For example, a plurality of the gas introduction paths 51*a*, 52*a*, and 53*a* may be connected to each one of the gas common paths 51*b*, 52*b*, and 53*b*. However, it is preferable that the number of gas introduction paths be smaller than the number of gas distribution paths connected to one gas common path.

Although, in the embodiment described above, the refrigerant flow path 32 is spirally formed in plan view, the present invention is not limited thereto. For example, the refrigerant flow path 32 may be zig-zagged in the plan view.

Although, in the embodiment described above, the cooling plate 30 is made of a composite material of a metal and a ceramic, the cooling plate 30 may be made of a material other than such a composite material (such as alumina or an aluminum alloy).

Although, in the embodiment described above, an example in which an electrostatic electrode is used as the electrode 23 that is built in the ceramic plate 20 is given, the present invention is not limited thereto. For example, in place of or in addition to the electrode 23, a heater electrode (resistance heating element) or an RF electrode may be built in the ceramic plate 20.

Although, in the embodiment described above, the ceramic plate 20 and the cooling plate 30 are joined to each other by the metal joint layer 40, a resin adhesive layer may be used in place of the metal joint layer 40.

International Application No. PCT/JP2022/038367, filed on Oct. 14, 2022, is incorporated herein by reference in its entirety.

What is claimed is:

1. A wafer placement table comprising:

a ceramic plate that has at least a wafer placement part at an upper surface thereof;

an electrostatic electrode that is built in the ceramic plate;

a cooling plate that is joined to a lower surface of the ceramic plate and that has a refrigerant flow path;

a gas common path that is provided, of an inside of the wafer placement table, at a location above the refrigerant flow path and below the electrostatic electrode;

a gas introduction path that extends from a lower surface of the cooling plate to the gas common path; and a gas distribution path that extends from the gas common path to the upper surface of the ceramic plate, a plurality of the gas distribution paths being provided for the gas common path, wherein the gas distribution paths have an outermost peripheral gas distribution path that is disposed at an outermost periphery of the ceramic plate, the outermost peripheral gas distribution path is provided at a position that does not overlap the refrigerant flow path in plan view, wherein a plurality of the gas common paths are concentrically provided, and wherein the outermost peripheral gas distribution path is connected to, of the plurality of the gas common paths, the gas common path that is positioned at an outermost periphery.

2. The wafer placement table according to claim 1, wherein the gas distribution paths are connected to the gas common path through a gas branch part extending in a radial direction of the gas common paths.

3. The wafer placement table according to claim 1, wherein at least a portion of the gas distribution path that is connected to the gas common path has a width that is larger than a width of the gas common path.

4. The wafer placement table according to claim 1, wherein the cooling plate is made of a composite material of a metal and a ceramic.

5. The wafer placement table according to claim 1, wherein the wafer placement part that is formed circularly and a ring-shaped focus ring placement part that surrounds the wafer placement part are provided at the upper surface of the ceramic plate, and wherein the outermost peripheral gas distribution path is a path that extends from the gas common path to the focus ring placement part.

6. The wafer placement table according to claim 1, wherein the wafer placement part that is formed circularly is provided at the upper surface of the ceramic plate, and wherein the outermost peripheral gas distribution path is a path that extends from the gas common path to the wafer placement part.

* * * * *